(12) United States Patent
Cho

(10) Patent No.: US 7,583,059 B2
(45) Date of Patent: Sep. 1, 2009

(54) APPARATUS AND METHOD FOR ESTIMATING STATE OF CHARGE OF BATTERY USING NEURAL NETWORK

(75) Inventor: Il Cho, Incheon (KR)

(73) Assignee: LG Chem, Ltd. (KR)

( * ) Notice: Subject to any disclaimer, the term of this patent is extended or adjusted under 35 U.S.C. 154(b) by 297 days.

(21) Appl. No.: 11/016,028

(22) Filed: Dec. 17, 2004

(65) Prior Publication Data
US 2005/0194936 A1    Sep. 8, 2005

(30) Foreign Application Priority Data
Dec. 18, 2003  (KR) ............... 10-2003-0092880

(51) Int. Cl.
*H02J 7/00* (2006.01)
*G01R 21/00* (2006.01)
(52) U.S. Cl. ........................ 320/132; 702/60
(58) Field of Classification Search ............ 320/132; 324/426–450; 702/60, 181, 182, 193
See application file for complete search history.

(56) References Cited

U.S. PATENT DOCUMENTS

| 5,936,385 A | 8/1999 | Patillon et al. ............ 320/136 |
| 6,285,163 B1 | 9/2001 | Watanabe et al. ........... 320/132 |
| 2003/0184307 A1* | 10/2003 | Kozlowski et al. ......... 324/427 |

FOREIGN PATENT DOCUMENTS

| JP | 09-243716 | 9/1997 |
| JP | 11-032442 A | 2/1999 |
| JP | 2002-228730 A | 8/2002 |
| JP | 2003-249271 | 9/2003 |
| KR | 1997-0024432 | 5/1997 |
| KR | 2002-0026428 | 4/2002 |
| WO | WO 00/67359 | 11/2000 |

OTHER PUBLICATIONS

Yon et al., Abstract, Dynamic Multidimensional Wavelet Neural Network and Its Application; 2000; Journal of Advanced Computational Inteligence and Inteligent Informatics; vol. 4, No. 5 pp. 336-340, 2000.*
PCT International Search Report for Application No. PCT/KR2004/003332; Date of Mailing International Search Report:Mar. 31, 2005.

* cited by examiner

Primary Examiner—Akm E Ullah
Assistant Examiner—Jue Zhang
(74) Attorney, Agent, or Firm—Cantor Colburn LLP

(57) ABSTRACT

Disclosed are an apparatus and a method for estimating a state of charge of a battery representing a non-linear characteristic by using a neural network. The apparatus includes a sensing section for detecting current, voltage and a temperature from a battery cell, a neural network performing a neural network algorithm and a learning algorithm based on data of the current, voltage and temperature transmitted thereto from the sensing section and present time data, thereby outputting the SOC of the battery estimated through a final learning algorithm, and a comparator for comparing an output value of the neural network with a predetermined target value and making the neural network iteratively perform the learning algorithm if a difference between the output value of the neural network and the predetermined target value is out of a predetermined limit, thereby update the learning algorithm to generate the final learning algorithm. The state of charge of the battery is precisely estimated through the neural network algorithm.

12 Claims, 4 Drawing Sheets

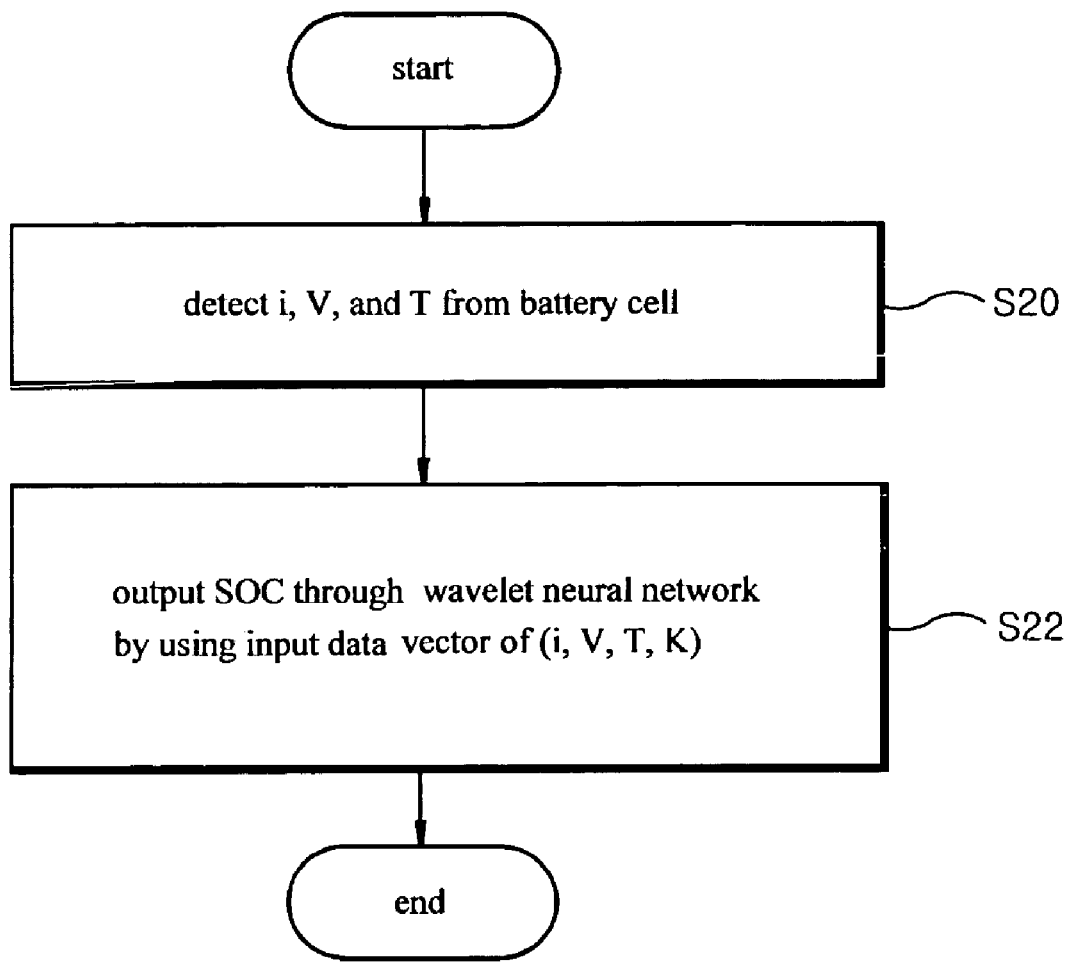

APPARATUS AND METHOD FOR ESTIMATING STATE OF CHARGE OF BATTERY USING NEURAL NETWORK

BACKGROUND OF THE INVENTION

1. Field of the Invention

The present invention relates generally to an apparatus and a method for estimating a state of charge (SOC) of a battery, and more particularly to an apparatus and a method for estimating a state of charge (SOC) of a battery representing a non-linear characteristic by using a neural network.

2. Description of the Related Art

In general, a state of charge (SOC) of a battery represents a non-linear characteristic, so it is difficult to precisely detect the SOC of the battery. Thus, a value of SOC of the battery is not detected but estimated. Particularly, the SOC of batteries used for hybrid electrical vehicles (HEVs) or electric vehicles (EVs) having high C-rates may represent strong non-linear characteristic, so it is almost impossible to precisely detect the SOC of such batteries.

Conventionally, an Ah-counting (ampere hour counting) scheme, an OCV (open circuit voltage) measurement scheme, or a battery impedance measurement scheme has been used for estimating the SOC of the battery.

First, the Ah-counting scheme estimates the SOC of the battery by detecting an actual capacity of the battery. In this case, an estimation value of the SOC of the battery may depend on a state of a sensor used for detecting the actual capacity of the battery. Thus, the estimation value of the SOC of the battery may vary depending on the degree of preciseness and error of the sensor.

The OCV measurement scheme estimates the SOC of the battery based on an open circuit voltage of the battery. In this case, however, the SOC of the battery can be estimated only under a resting state of the battery. In addition, the OCV measurement scheme is influenced by external environment, such as an external temperature.

The battery impedance measurement scheme estimates the SOC of the battery based on an impedance value of the battery. However, the battery impedance measurement scheme is significantly influenced by an external temperature, so that reliability for the estimation value of the SOC of the battery may be lowered.

Therefore, it is necessary to provide a method for precisely estimating the SOC of the battery while minimizing an estimation error thereof regardless of an external temperature.

SUMMARY OF THE INVENTION

The present invention is directed to an apparatus and a method for estimating an SOC of a battery that substantially obviate one or more problems due to limitations and disadvantages of the related art.

It is an object of the present invention to provide an apparatus and a method for precisely estimating an SOC of a battery by using a neural network.

Another object of the present invention is to provide an apparatus and a method capable of dynamically estimating an SOC of a battery by using a minimum of data under various environments including various temperatures and C-rates.

To achieve these objects and other advantages in accordance with the purpose of the invention, as embodied and broadly described herein, there is provided an apparatus for estimating a state of charge (SOC) of a battery, the apparatus comprising: a sensing section for detecting current, voltage and a temperature from a battery cell; a neural network performing a neural network algorithm and a learning algorithm based on data of the current, voltage and temperature transmitted thereto from the sensing section and present time data, thereby outputting the SOC of the battery estimated through a final learning algorithm; and a comparator for comparing an output value of the neural network with a predetermined target value and making the neural network iteratively perform the learning algorithm if a difference between the output value of the neural network and the predetermined target value is out of a predetermined allowable limit, and update the learning algorithm to generate the final learning algorithm.

According to the preferred embodiment of the present invention, the predetermined target value may be a "true" SOC of the battery. However, it is difficult to precisely calculate the predetermined target value, so a reference value obtained through performing an experiment under specific conditions is used as a target value. For example, the reference value is obtained based on a value of subtracting ampere-hour data of a charger/discharger from rated capacity of the battery, or an open circuit voltage value of the battery, respectively or mathematically compensating each other.

Although the present invention is described in relation to the neural network in the form of a dynamic multi-dimensional wavelet neural network algorithm, it is also possible to use a dynamic wavelet neural network algorithm or a static wavelet neural network algorithm. In addition, although the present invention is described in relation to a back-propagation learning algorithm, it is also possible to use a Kalman filter scheme, GA, or a fuzzy learning algorithm.

To achieve the above objects of the present invention, according to another aspect of the present invention, there is provided a method for estimating a state of charge (SOC) of a battery by using a neural network, the method comprising the steps of: (a) performing a learning algorithm based on data of the current, voltage and a temperature detected from the battery and present time data; and (b) outputting the SOC of the battery estimated through a final learning algorithm generated by performing the learning algorithm.

According to the preferred embodiment of the present invention, step (a) includes the substeps of detecting the current, voltage and temperature from the battery, performing a neural network algorithm by utilizing data of the current, voltage and temperature detected from the battery and present time data as learning data, checking whether a difference between an output value outputted through the neural network algorithm and a predetermined target value is within a predetermined allowable limit, and iteratively performing a learning algorithm if the difference is out of the predetermined allowable limit, thereby updating the learning algorithm to generate the final learning algorithm.

According to the preferred embodiment of the present invention, step (b) includes the substeps of detecting the current, voltage and temperature from the battery, and outputting the SOC of the battery by estimating the SOC of the battery through the final learning algorithm obtained through step (a) based on data of the current, voltage and temperature detected from the battery and present time data.

Additional advantages, objects, and features of the invention will be set forth in part in the description which follows and in part will become apparent to those having ordinary skill in the art upon examination of the following or may be learned by practicing the invention. The objectives and other advantages of the invention may be realized and attained by the structure particularly pointed out in the written description and claims hereof as well as the appended drawings.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings:

FIG. 4 is a flowchart sequentially illustrating steps for outputting an SOC of a battery by utilizing a final estimation algorithm obtained through the learning steps shown in FIG. 3.

DETAILED DESCRIPTION OF THE PREFERRED EMBODIMENT

Reference will now be made in detail to the preferred embodiment of the present invention, examples of which are illustrated in the accompanying drawings. Wherever possible, the same reference numbers will be used throughout the drawings to refer to the same or like parts.

Hereinafter, a preferred embodiment of the present invention will be explained in detail with reference to the accompanying drawings.

Figure 1:
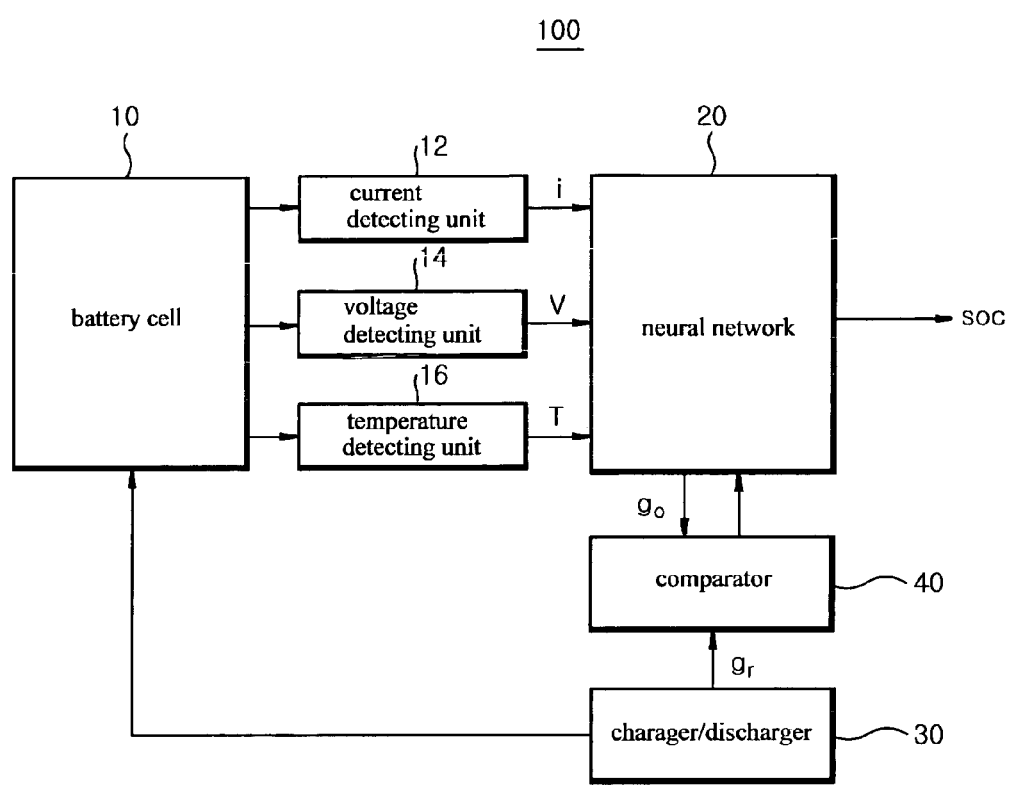
FIG. 1 is a block view schematically illustrating an apparatus for estimating an SOC of a battery according to a preferred embodiment of the present invention.

FIG. 1 is a block view schematically illustrating an apparatus 100 for estimating an SOC of a battery according to a preferred embodiment of the present invention.

Referring to FIG. 1, the apparatus 100 for estimating an SOC of a battery by using a neural network includes a current detecting unit 12 for detecting current (i) from a battery cell 10, a voltage detecting unit 14 for detecting voltage (V) from the battery cell 10, a temperature detecting unit 16 for detecting a temperature (T) from the battery cell 10, a neural network 20 for performing a neural network algorithm and a learning algorithm by utilizing learning data including the current (i), voltage (V) and temperature (T) detected by the above detecting units 12, 14 and 16 and time (K) and for outputting an estimated SOC based on a finally learned algorithm formula generated by completing the neural network algorithm and the learning algorithm, a charger/discharger 30 for feeding charging/discharging current to the battery cell 10, and a comparator 40 which compares an output SOC ($g_o$) of the battery outputted from the neural network 20 with a target SOC ($g_T$), checks whether a difference between the output SOC ($g_o$) and the target SOC ($g_T$) is within a predetermined allowable limit, and makes the neural network 20 iteratively perform the learning algorithm if the difference is out of the predetermined allowable limit, thereby update the learning algorithm to generate the final learning algorithm.

Preferably, the target SOC ($g_T$) is obtained through performing an experiment under specific conditions. For example, the target SOC ($g_T$) is obtained by subtracting Ah (ampere hour) data ($g_r$) of the charger/discharger 30 from rated capacity ($g_N$) of a battery, that is, $g_T = g_N - g_r$. This is because an ideal target SOC can be obtained by subtracting the Ah data corresponding to capacity that has already been used in the battery from the rated capacity of the battery, if the error is within the acceptable limit. Alternatively the target SOC ($g_T$) is obtained based on an open circuit voltage value of the battery. It is preferable to mathematically compensate the value of Ah-counting scheme and the value of OCV measurement scheme each other.

Figure 2:
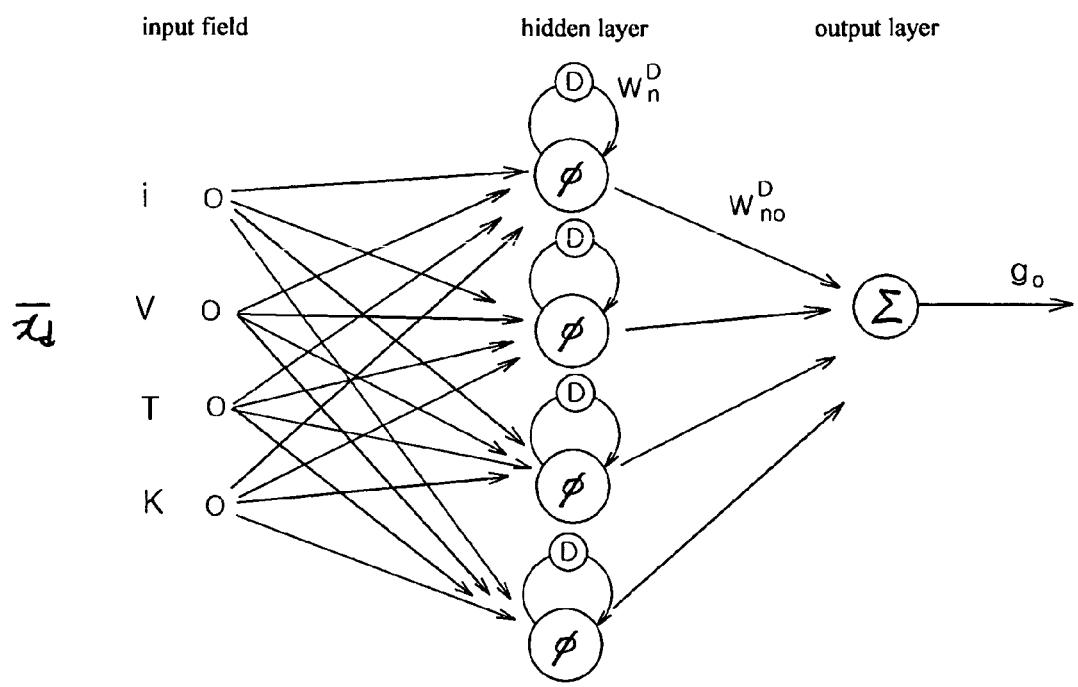
FIG. 2 is a view showing a structure of a dynamic multi-dimensional wavelet neural network used for the present invention.

FIG. 2 is a view showing a structure of a neural network used for the present invention.

According to the preferred embodiment of the present invention, the neural network includes a dynamic multi-dimensional wavelet neural network.

Referring to FIG. 2, the dynamic multi-dimensional wavelet neural network includes an input field, a hidden layer and an output layer.

In order to apply a battery SOC estimation algorithm to the dynamic multi-dimensional wavelet neural network, an arbitrary function $f(x) \in L^2(R)$ can be resolved as follows based on a wavelet theory.

$$f(x) = \sum_n a_n \varphi(2^m x - n) \qquad \text{Equation 1}$$

Herein, $\alpha_n$ is a coefficient of a basis function $\phi(\cdot)$ for resolving the arbitrary function $f(x)$. In addition, $2^m$ and n are dilation and translation parameters for the basis function $\phi(\cdot)$, respectively.

In addition, an approximation function g(x) for the arbitrary function $f(x)$ is presented as Equation 2.

$$g(x) \approx \sum_n a_n \varphi(2^m x - n) \qquad \text{Equation 2}$$

Equation 2 can be applied to the dynamic multi-dimensional wavelet neural network shown in FIG. 2 as follows:

In FIG. 2, $x_d(k)$ is an input data vector inputted into the dynamic multi-dimensional wavelet neural network. According to the present embodiment, $x_d(k)$ is a vector including input data consisting of the current, voltage, and temperature inputted into the dynamic multi-dimensional wavelet neural network during a predetermined period of time (k). That is, $x_d(k) = (i, v, T, k)$. In addition, $g_o(x_d(k))$ is an output value, which is estimated through the dynamic multi-dimensional wavelet neural network based on the input data. The $g_o(x_d(k))$ is presented as Equation 3.

$$\begin{aligned} g_o(x_d(k)) &= \sum_n W_{no}^o \varphi\left[\sum_d 2^m(x_d(k) - n) + W_n^D X_n(k-1)\right] \\ &= \sum_n W_{no}^o \varphi\left[\sum_d 2^m(x_d(k) - n) + \right. \\ &\quad \left. W_n^D \varphi\left(\sum_d 2^m(x_d(k-1) - n) + W_n^D X_n(k-2)\right)\right] \end{aligned} \qquad \text{Equation 3}$$

Herein, $W_n^D$ and $W_{no}^o$ are coefficients representing connection weight, which is updated in every time (k) based on back-propagation (BP) learning algorithm so that the arbitrary function is approximately identified with a non-linear function.

If the difference between the output value $g_o$ and the target value $g_T$ detected by the comparator 40 of the dynamic multidimensional wavelet neural network does not exist within a predetermined allowable limit (for example, 3%), the following back-propagation learning algorithm is iteratively carried out by means of the neural network 20.

Prior to explaining the back-propagation (BP) learning algorithm, it is noted that an error function is defined as Equation 4.

$$E = \frac{1}{2}(g_T(k) - g_o(k))^2 \quad \text{Equation 4}$$

Herein, $g_T(k)$ is a desired output value, that is, the target value, and $g_o(k)$ is an actual output value of the neural network 20. When replacing Equation 4 with $g_T(k) - g_o(k) = e(k)$, an error gradient is obtained as represented in Equation 5.

$$\frac{\partial E}{\partial W} = e(k)\frac{\partial g(k)}{\partial W} \quad \text{Equation 5}$$

Also, an error gradient of $W_n^D$, $W_{no}^o$ is obtained as represented in Equation 6.

(1) $\dfrac{\partial g_o(k)}{\partial W_{no}^o} = X_n(k)$      Equation 6

(2) $\dfrac{\partial g_o(k)}{\partial W_n^D} = \sum_o W_{no}^o P_n(k)$ (3) $P_n(k) = \varphi(S_n(k))(X_n(k-1) + W_n^D P_n(k-1))$, $P_n(0) = 0$ Therefore, a final update for the connection weight is carried out as follows:

$$W(t+1) = W(t) + \eta\left(-\frac{\partial E}{\partial W}\right), \text{ herein, } \eta \text{ is a learning rate.} \quad \text{Equation 7}$$

In this way, the neural network 20 iteratively sends a new output value $g_o$, which is newly generated based on updated values of $W_n^D$, $W_{no}^o$, and $X_n(k)$, to the comparator 40 while iteratively performing the back-propagation learning algorithm. In addition, such a procedure is iteratively carried out until the difference between the output value $g_o$ and the target value $g_T$ is defined within the predetermined allowable limit.

When the difference between the output value $g_o$ and the target value $g_T$ is defined within the predetermined allowable limit, the learning algorithm by using the neural network is completed and the estimated SOC is outputted by using the final estimation algorithm formula (that is, Equation 3) obtained through the learning algorithm.

Hereinafter, a method for estimating the SOC of the battery will be described with reference to FIGS. 3 and 4.

The method for estimating the SOC of the battery according to the present invention includes a learning step by using the neural network, that is, a step of obtaining a final estimation algorithm by performing the neural network algorithm and the learning algorithm, and an SOC outputting step for outputting the SOC of the battery by using the final estimation algorithm.

Figure 3:
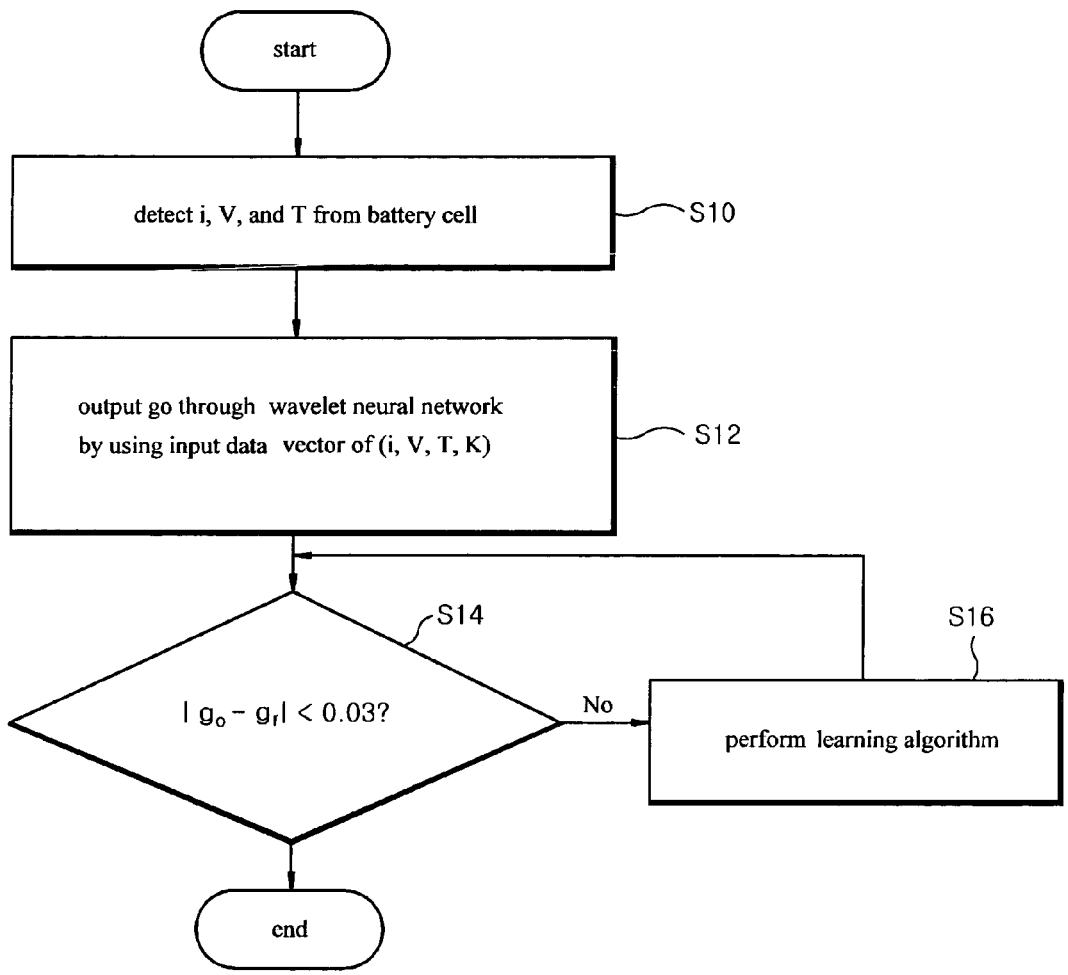
FIG. 3 is a flowchart sequentially illustrating learning steps by using a neural network according to the preferred embodiment of the present invention.

FIG. 3 is a flowchart sequentially illustrating learning steps by using the neural network according to the preferred embodiment of the present invention.

Referring to FIG. 3, the current (i), voltage (v) and temperature (T) are detected from the battery cell 10 (step 10). Then, the dynamic multi-dimensional wavelet neural network algorithm is carried out by utilizing the detected current (i), voltage (v) and temperature (T) and time data (k) thereof as an input data vector, that is, $x_d(k) = (i, v, T, k)$. As a result, an output value $g_o$ can be obtained (step 12).

After that, the output value $g_o$ is compared with the target value $g_T$, and it is checked whether the difference between the output value $g_o$ and the target $g_T$ is within the predetermined error limit of 3% (step 14). Although the predetermined allowable error limit is set to 3% in the present embodiment, the predetermined error limit can be changed, if necessary. The SOC of the battery can be precisely estimated as the allowable error limit becomes reduced. In contrast, the SOC of the battery may be inaccurately estimated as the allowable error limit becomes enlarged.

If it is determined in step 14 that the difference exceeds the predetermined allowable error limit, the back-propagation learning algorithm is carried out, thereby obtaining an updated output value $g_o$ (step 16). Then, the procedure returns to step 14.

In the meantime, if it is determined in step 14 that the difference is equal to or less than the predetermined allowable error limit, the neural network learning algorithm is completed (step 18). As a result, the final estimation algorithm formula (that is, Equation 3) can be obtained through the learning algorithm.

FIG. 4 is a flowchart illustrating a procedure for outputting the SOC of the battery by utilizing the final estimation algorithm obtained through the learning steps shown in FIG. 3.

Referring to FIG. 4, the current (i), voltage (v) and temperature (T) are detected from the battery cell 10 (step 20). Then, the SOC of the battery is outputted by utilizing the final estimation algorithm obtained through the learning algorithm shown in FIG. 3, while employing the detected current (i), voltage (v) and temperature (T) and time data (k) thereof as an input data vector, that is, $x_d(k) = (i, v, T, k)$ (step 22).

Although the present invention has been described in relation to the neural network in the form of the dynamic multi-dimensional wavelet neural network, the present invention is not exclusively limited thereto. That is, the present invention is applicable for a feedforward neural network, recurrent neural network, a wavelet neural network, etc.

In addition, although the present invention employs the back-propagation learning algorithm as a learning algorithm, the present invention is not exclusively limited thereto. For instance, the present invention can employ a conventional Kalman filter scheme, GA, and a fuzzy learning algorithm.

As described above, the present invention can dynamically estimate the SOC of the battery through the neural network algorithm and the learning algorithm. Particularly, the SOC of the battery can be precisely estimated even under various external environments including various temperatures and C-rates. The present invention is effectively available in a field of hybrid electrical vehicles, in which the SOC of the battery must be precisely estimated.

The forgoing embodiments are merely exemplary and are not to be construed as limiting the present invention. The present teachings can be readily applied to other types of apparatuses. The description of the present invention is intended to be illustrative, and not to limit the scope of the claims. Many alternatives, modifications, and variations will be apparent to those skilled in the art.

What is claimed is:

1. An apparatus for estimating a state of charge (SOC) of a battery, the apparatus comprising:

a sensing section for detecting current, voltage and a temperature from a battery cell;

a neural network performing a neural network algorithm for calculating SOC of the battery by processing data of the current, voltage and temperature transmitted thereto from the sensing section and time data at which the current, voltage and temperature are measured, according to a function having a predetermined weight, the predetermined weight being updated by a learning algorithm that directs the calculated SOC of the battery to follow a predetermined target value; and a comparator in communication with the neural network to monitor the output of the neural network during calculation of the SOC of the battery, which compares the SOC of the battery calculated through the neural network with the predetermined target value varying with charging or discharging of the battery and provides a control signal to the neural network to perform the learning algorithm if a difference between the calculated SOC of the battery and the predetermined target value is out of a predetermined limit.

2. The apparatus as claimed in claim 1, wherein the predetermined target value is a reference value obtained through performing an experiment under specific conditions.

3. The apparatus as claimed in claim 2, wherein the reference value is obtained based on a value of subtracting ampere-hour data of a charger/discharger from rated capacity of the battery, or an open circuit voltage value of the battery, respectively or mathematically compensating each other.

4. The apparatus as claimed in claim 1, wherein the neural network includes a dynamic wavelet neural network algorithm or a static wavelet neural network algorithm.

5. The apparatus as claimed in claim 4, wherein the neural network includes a dynamic multi-dimensional wavelet neural network algorithm.

6. The apparatus as claimed in claim 1, wherein the learning algorithm includes a back-propagation learning algorithm, a Kalman filter scheme, GA, or a fuzzy learning algorithm.

7. A method for estimating a state of charge (SOC) of a battery by using a neural network in communication with a comparator, the method comprising the steps of:
(a) sensing current, voltage and a temperature from the battery;
(b) calculating a SOC of the battery according to a neural network algorithm, defined by a function with a predetermined weight, by processing data of the sensed current, voltage and temperature and time data at which the current, voltage and temperature are measured, and outputting the SOC of the battery to a battery management means;
(c) calculating the difference value between the calculated SOC of the battery and a predetermined target value varying with charging or discharging of the battery and
(d) monitoring the difference value during calculation of the SOC of the battery; and
(e) performing a learning algorithm so as to update the weight of the neural network such that the calculated SOC of the battery can follow the predetermined target value if the difference value is out of a predetermined limit.

8. The method as claimed in claim 7, wherein the predetermined target value is a reference value obtained through performing an experiment under specific conditions.

9. The method as claimed in claim 8, wherein the reference value is obtained based on a value of subtracting ampere-hour data of a charger/discharger from rated capacity of the battery, or an open circuit voltage value of the battery, respectively or mathematically compensating each other.

10. The method as claimed in claim 7, wherein the neural network includes a dynamic wavelet neural network algorithm or a static wavelet neural network algorithm.

11. The method as claimed in claim 10, wherein the wavelet neural network includes a dynamic multi-dimensional wavelet neural network algorithm.

12. The method as claimed in claim 7, wherein the learning algorithm includes a back-propagation learning algorithm, a Kalman filter scheme, GA, or a fruzzy learning algorithm.

* * * * *